(12) United States Patent  (10) Patent No.: US 9,190,419 B2
Chang et al.  (45) Date of Patent: Nov. 17, 2015

(54) DIODE STRUCTURE AND METHOD FOR FINFET TECHNOLOGIES

(71) Applicant: International Business Machines Corporation, Armonk, NY (US)

(72) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

( * ) Notice: Subject to any disclaimer, the term of this patent is extended or adjusted under 35 U.S.C. 154(b) by 56 days.

(21) Appl. No.: 13/761,430

(22) Filed: Feb. 7, 2013

(65) Prior Publication Data

US 2014/0217506 A1 Aug. 7, 2014

(51) Int. Cl.
| H01L 21/8238 | (2006.01) |
| H01L 27/12 | (2006.01) |
| H01L 29/861 | (2006.01) |
| H01L 21/84 | (2006.01) |
| H01L 29/66 | (2006.01) |
| H01L 29/78 | (2006.01) |

(52) U.S. Cl.
CPC .......... *H01L 27/1211* (2013.01); *H01L 21/845* (2013.01); *H01L 29/66545* (2013.01); *H01L 29/861* (2013.01); *H01L 29/785* (2013.01)

(58) Field of Classification Search
CPC .. H01L 29/78; H01L 29/785; H01L 29/66795
USPC .................. 438/202, 349; 257/350, 370, 586
See application file for complete search history.

(56) References Cited

U.S. PATENT DOCUMENTS

| 6,642,090 | B1 * | 11/2003 | Fried et al. .................... 438/164 |
| 6,835,967 | B2 | 12/2004 | Yeo et al. |
| 6,987,289 | B2 | 1/2006 | Nowak |
| 7,432,122 | B2 | 10/2008 | Mathew et al. |
| 7,560,784 | B2 | 7/2009 | Cheng et al. |
| 7,884,004 | B2 | 2/2011 | Bangsaruntip et al. |
| 7,888,775 | B2 | 2/2011 | Russ et al. |
| 7,893,492 | B2 | 2/2011 | Bedell et al. |
| 7,923,337 | B2 | 4/2011 | Chang et al. |
| 8,669,615 | B1 * | 3/2014 | Chang et al. .................. 257/347 |
| 2004/0150029 | A1 * | 8/2004 | Lee ............................... 257/308 |
| 2005/0153562 | A1 * | 7/2005 | Furukawa et al. ............ 438/694 |
| 2006/0063334 | A1 | 3/2006 | Donze et al. |
| 2007/0075351 | A1 * | 4/2007 | Schulz et al. ................. 257/314 |
| 2007/0298549 | A1 * | 12/2007 | Jurczak et al. ................ 438/149 |

(Continued)

OTHER PUBLICATIONS

S. Bangsaruntip et al., "High performance and highly uniform gate-all-around silicon nanowire MOSFETs with wire size dependent scaling," 2009 IEEE International Electron Devices Meeting (IEDM), Dec. 7-9, 2009, pp. 297-300.

*Primary Examiner* — Zandra Smith
*Assistant Examiner* — John M Parker
(74) *Attorney, Agent, or Firm* — Michael J. Chang, LLC

(57) ABSTRACT

A method of fabricating an electronic device includes the following steps. A SOI wafer is provided having a SOI layer over a BOX. An oxide layer is formed over the SOI layer. At least one first set and at least one second set of fins are patterned in the SOI layer and the oxide layer. A conformal gate dielectric layer is selectively formed on a portion of each of the first set of fins that serves as a channel region of a transistor device. A first metal gate stack is formed on the conformal gate dielectric layer over the portion of each of the first set of fins that serves as the channel region of the transistor device. A second metal gate stack is formed on a portion of each of the second set of fins that serves as a channel region of a diode device.

20 Claims, 6 Drawing Sheets

(56) References Cited

U.S. PATENT DOCUMENTS

| | | | |
|---|---|---|---|
| 2009/0041406 A1* | 2/2009 | Schulz | 385/14 |
| 2009/0309167 A1* | 12/2009 | Russ et al. | 257/370 |
| 2010/0295022 A1 | 11/2010 | Chang et al. | |
| 2011/0108900 A1 | 5/2011 | Chang et al. | |
| 2011/0111596 A1 | 5/2011 | Kanakasabapathy | |
| 2011/0133162 A1 | 6/2011 | Bangsaruntip et al. | |
| 2011/0193183 A1 | 8/2011 | Agarwal et al. | |
| 2012/0007051 A1 | 1/2012 | Bangsaruntip et al. | |

* cited by examiner

DIODE STRUCTURE AND METHOD FOR FINFET TECHNOLOGIES

FIELD OF THE INVENTION

The present invention relates to FIN field-effect transistor (FET)-based electronic devices, and more particularly, to techniques for fabricating FIN FET diode devices.

BACKGROUND OF THE INVENTION

Non-transistor field effect transistor (FET) elements, such as capacitors and diodes are important elements in complementary metal-oxide semiconductor (CMOS) technology. Much research has been done regarding planar diode and capacitor device structures. See, for example, U.S. Patent Application Publication Number 2011/0108900 A1 filed by Chang et al., entitled "Bi-Directional Self-Aligned FET Capacitor."

However, the use of non-planar devices in future CMOS technologies is becoming increasingly more pervasive. One key issue in the use of these devices is other critical technology elements, such as diodes.

Therefore, solutions for diodes in FINFET technologies would be desirable.

SUMMARY OF THE INVENTION

The present invention provides techniques for fabricating FIN field-effect transistor (FET)-based electronic devices. In one aspect of the invention, a method of fabricating an electronic device is provided. The method includes the following steps. A semiconductor-on-insulator (SOI) wafer is provided having a SOI layer over a buried oxide (BOX). An oxide layer is formed over the SOI layer. At least one first set of fins is patterned in the SOI layer and the oxide layer and at least one second set of fins is patterned in the SOI layer and the oxide layer. A conformal gate dielectric layer is selectively formed on a portion of each of the first set of fins that serves as a channel region of a transistor device. A first metal gate stack is formed on the conformal gate dielectric layer over the portion of each of the first set of fins that serves as the channel region of the transistor device. A second metal gate stack is formed on a portion of each of the second set of fins that serves as a channel region of a diode device.

In another aspect of the invention, an electronic device is provided. The electronic device includes, a SOI wafer having an oxide layer and a SOI layer over a BOX, and at least one first set of fins patterned in the SOI layer and the oxide layer and at least one second set of fins patterned in the SOI layer and the oxide layer; a conformal gate dielectric layer on a portion of each of the first set of fins that serves as a channel region of a transistor device; a first metal gate stack on the conformal gate dielectric layer over the portion of each of the first set of fins that serves as the channel region of the transistor device; and a second metal gate stack on a portion of each of the second set of fins that serves as a channel region of a diode device.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating FIN field-effect transistor (FET) diode devices. Techniques for fabricating diodes in gate-all-around nanowire devices are described for example in U.S. patent application Ser. No. 13/761,453, filed on Feb. 7, 2013, entitled "Diode Structure and Method for Gate All Around Silicon Nanowire Technologies," the contents of which are incorporated by reference herein. Techniques for fabricating diodes in wire-last nanomesh devices are described for example in U.S. patent application Ser. No. 13/761,476, filed on Feb. 7, 2013, entitled "Diode Structure and Method for Wire-Last Nanomesh Technologies," the contents of which are incorporated by reference herein.

The present techniques assume a replacement gate fabrication process flow (also referred to herein as a "gate-last"

approach). In a replacement gate or gate-last approach, a dummy gate is formed and then replaced later in the process with a permanent, replacement gate. Currently, two variations of the gate-last approach exist, a gate-last fin-first approach and a gate-last fin-last approach. A gate-last fin-first approach involves patterning one or more fin-shaped channels, forming a dummy gate(s) over the channels, then removing the dummy gate and replacing the dummy gate(s) with metal material late in the flow. A gate-last fin-last approach was developed to improve the fin patterning process and to permit self-aligned source and drain formation. See, for example, U.S. Pat. No. 7,923,337 issued to Chang et al., entitled "Fin Field Effect Transistor Devices with Self-Aligned Source and Drain Regions," the contents of which are incorporated by reference herein. With either gate-last approach, a dummy gate is formed early in the process and then, late in the process flow, is removed and replaced with a replacement gate.

The present techniques will be described by way of reference to FIGS. 1-12. In order to illustrate the compatibility of the present techniques with the fabrication of non-diode devices, the following description and related figures will describe/depict the fabrication of a diode and a non-diode device on a common wafer. For instance, the fabrication of a FINFET-diode and a regular FINFET transistor on a common wafer will be described. It is to be understood however that any combination of diode and non-diode devices (or even simply one or more diode devices alone) may be produced using the present techniques.

Figure 1:
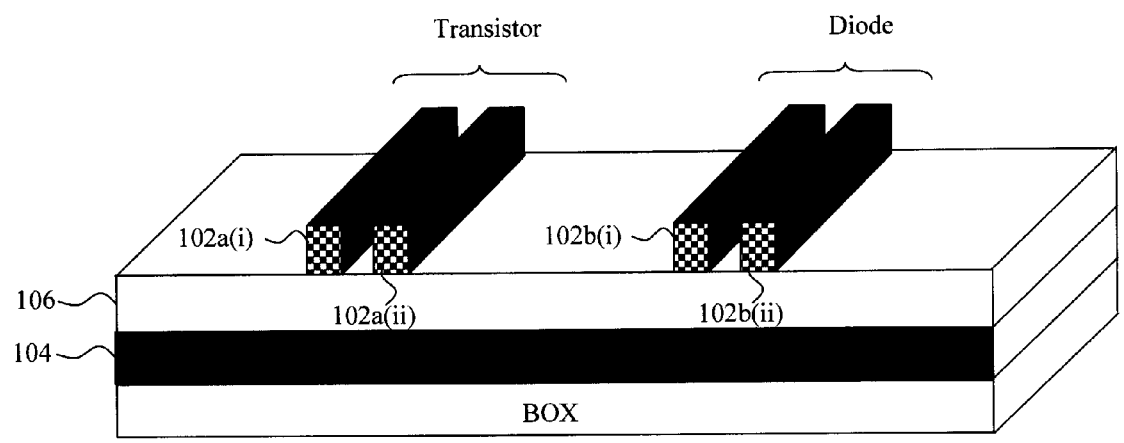
FIG. 1 is a three-dimensional diagram illustrating poly-silicon mandrels having been formed on a starting wafer (i.e., a silicon-on-insulator (SOI) wafer having an SOI layer and an oxide layer over the SOI layer) according to an embodiment of the present invention.
Figure 2:
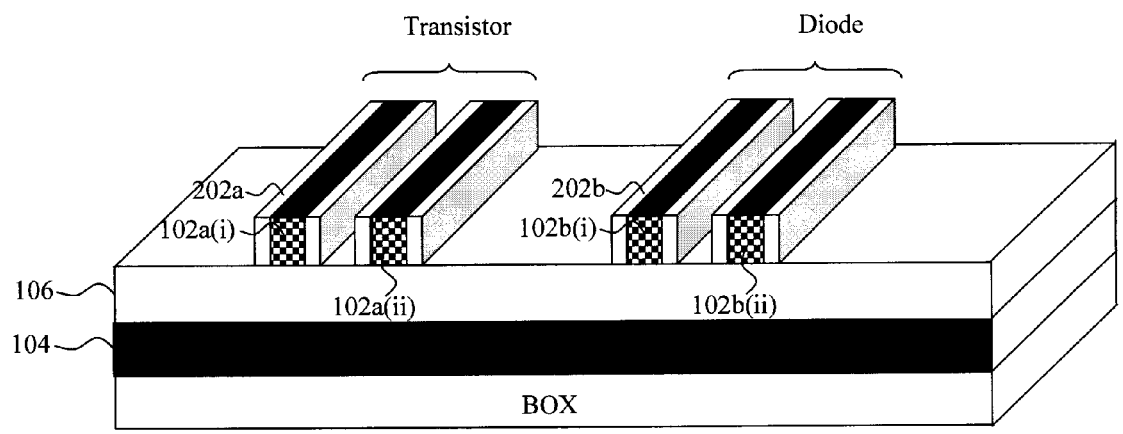
FIG. 2 is a three-dimensional diagram illustrating spacers having been formed on opposite sides of the poly-silicon mandrels according to an embodiment of the present invention.
Figure 3:
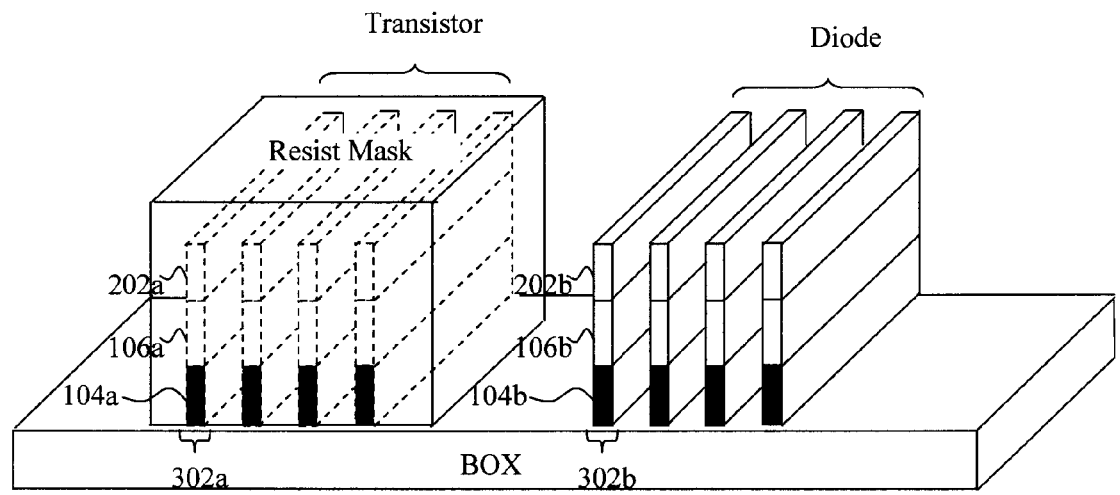
FIG. 3 is a three-dimensional diagram illustrating the spacers having been used as a hardmask to pattern fins in the SOI layer/oxide layer according to an embodiment of the present invention.
Figure 4:
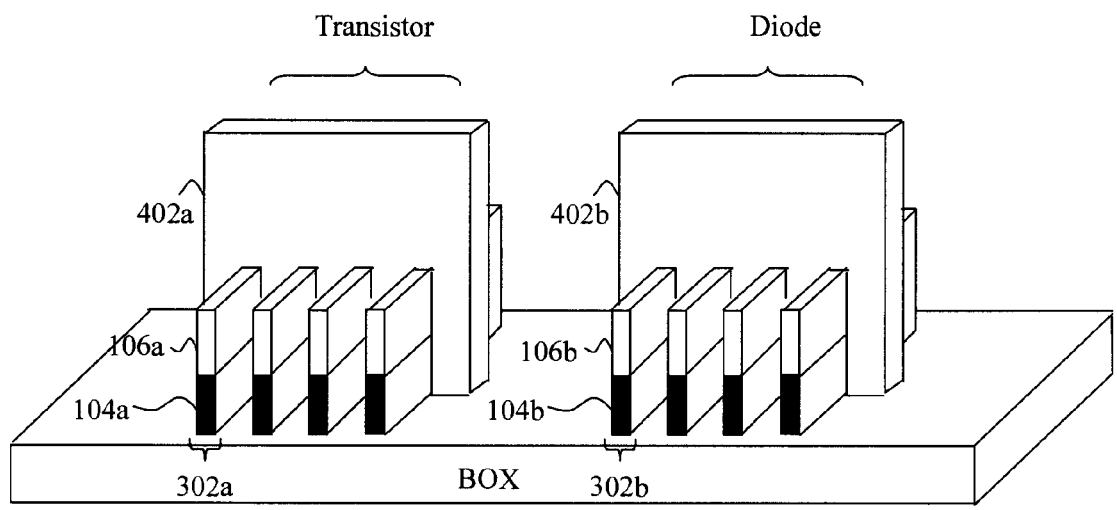
FIG. 4 is a three-dimensional diagram illustrating dummy gates having been formed on a portion of the fins that will serve as channel regions of the FIN FET devices according to an embodiment of the present invention.

An exemplary embodiment of the present techniques for fabricating an electronic device in which a FINFET diode device is fabricated (along with a non-diode, i.e., "regular" FINFET transistor device on a common wafer) is depicted in FIGS. 1-12. It is notable that FIGS. 1-2 illustrate use of a side wall image transfer (SIT) process to pattern the fins. However, it is to be understood that any fin lithography process may be employed in the same manner. The advantage to a SIT process is that it permits scaling beyond that achievable using standard lithography. As will be described in detail below, a SIT process can involve use of a sacrificial mandrel (typically formed from polysilicon) to place spacers. Once the mandrel is removed, the spacers can be used as a hardmask to pattern the fins.

Advantageously, the present techniques may be employed in the fabrication of an electronic device to selectively fabricate a FINFET-diode device(s) on a wafer, relative to other devices on the wafer. By way of example only, in one implementation described below, the present techniques are used to fabricate a FINFET-diode device and a FINFET on the same wafer. This example (of one FINFET-diode device and one non-diode FINFET device being fabricated on the same wafer) is being provided merely to illustrate how the present techniques can be effectively integrated with a process flow to produce both types of devices on the same wafer. As provided above, it is to be understood that any combination of non-diode FINFET and FINFET-diode devices (or even simply one or more FINFET-diode devices alone) may be produced using the present techniques.

Accordingly, FIG. 1 is a three-dimensional diagram illustrating poly-silicon mandrels 102a(i)/102a(ii), and 102b(i)/102b(ii) having been formed on a starting wafer. In the exemplary embodiment depicted, two FINFET devices will be fabricated on the starting wafer, one being a non-diode FINFET transistor and the other being a FINFET-diode. As described above, this configuration is merely exemplary and meant to illustrate the present techniques.

According to an exemplary embodiment, the starting wafer is a semiconductor-on-insulator (SOI) wafer. An SOI wafer generally includes an SOI layer (here SOI layer 104) separated from a substrate by a buried oxide or BOX. For ease and clarity of depiction, the underlying substrate is not shown. Suitable semiconductor materials for use in SOI layer 104 include, but are not limited to, silicon, germanium, silicon germanium, and silicon carbon.

An oxide layer (e.g., silicon dioxide) 106 is present on the SOI layer 104. Oxide layer 106 can be deposited on the SOI layer 104 using a process such as chemical vapor deposition (CVD) or grown on SOI layer 104, e.g., by a thermal oxidation process. The poly-silicon mandrels can be formed on the wafer by blanket depositing a layer of poly-silicon on the oxide layer 106 and then patterning the poly-silicon layer, e.g., using a directional reactive ion etching (RIE) process. It is notable that (as will be apparent from the description provided below) the number of mandrels being formed in this step is a function of the number of fins to be formed for each FINFET device. The number of fins being produced in the example shown (and hence the number of mandrels required) is merely to illustrate the present techniques.

The next step in the SIT process is to form spacers 202a and 202b on opposite sides of the poly-silicon mandrels 102a(i)/102a(ii) and 102b(i)/102b(ii), respectively. See FIG. 2. As will be described in detail below, once the poly-silicon mandrels are removed, the spacers are used as a hardmask to pattern fins in the SOI layer 104/oxide layer 106. Advantageously, this SIT process permits scaling fin dimensions beyond what is achievable using standard lithography techniques. See, for example, U.S. Patent Application Publication Number 2011/0111596 filed by Kanakasabapathy, entitled "Sidewall Image Transfer Using the Lithography Stack as the Mandrel," the contents of which are incorporated by reference herein. According to an exemplary embodiment, the spacers 202a and 202b are formed by first depositing a suitable spacer material (such as silicon nitride) onto the wafer, and then using standard lithography and etching techniques to pattern the spacer material into the spacers.

The poly-silicon mandrels are then removed (selective to the spacers), for example, using wet chemical etching or dry etching. The spacers 202a and 202b are then used as a hardmask to pattern sets of fins 302a and 302b in the SOI layer 104/oxide layer 106. See FIG. 3. According to an exemplary embodiment, the fins 302a, and 302b are patterned (with the spacers 202a and 202b acting as a hardmask) using a directional RIE process. The now-patterned SOI layer 104/oxide layer 106 are hereinafter given the reference numerals 104a-b and 106a-b, respectively. The spacers 202a, and 202b (i.e., the spacer hardmasks) may now be removed (e.g., using a wet etch), or left in place for now and removed following the fin doping (see below).

According to an exemplary embodiment, the fins of the FINFET-diode device(s) are now selectively doped, e.g., with either an n-type or p-type dopant. This process is selective in the sense that the fins in the FINFET transistor device(s) will remain undoped. To achieve this selective doping, according to an exemplary embodiment, standard lithography techniques are used to pattern a resist mask over the transistor devices which will cover and mask the transistor devices during the diode doping (such that the fins in the transistor device remain undoped). This mask is shown schematically in FIG. 3. The fins of the diode device are then selectively doped. Suitable n-type dopants include, but are not limited to, phosphorous and arsenic and suitable p-type dopants include, but are not limited to, boron. Following doping, the resist mask can then be removed along with the spacers 202a and 202b (i.e., the spacer hardmasks) using, for example, a wet etching process.

Following patterning of the fins (and selective doping), dummy gates 402a and 402b are formed for each of the FINFET devices, each dummy gate covering a portion of the fins which will serve as channel regions of the respective devices. See FIG. 4. According to an exemplary embodiment, the dummy gates 402a and 402b are formed from polycrystalline silicon (polysilicon). The dummy gates 402a and 402b may be formed, for example, by first depositing a polysilicon layer over the fins (using, e.g., low pressure chemical vapor deposition (LPCVD)). A resist is then deposited on the polysilicon layer, masked and patterned with the footprint and location of each of the dummy gates. A polysilicon-selective RIE is then used to remove all but portions of the polysilicon centrally located over the fins, which are the dummy gates 402a and 402b.

Figure 5:
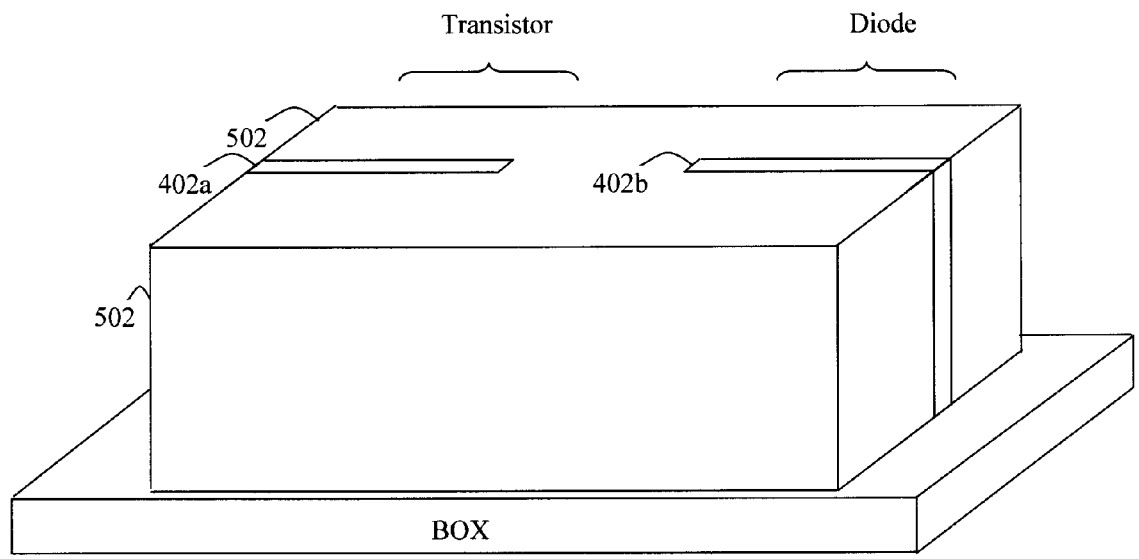
FIG. 5 is a three-dimensional diagram illustrating a filler layer having been deposited around each of the dummy gates according to an embodiment of the present invention.

Next, as shown in FIG. 5, a filler layer 502 is deposited around the dummy gates 402a and 402b. The filler layer 502 can be formed from any suitable filler material, including but not limited to, a dielectric such as silicon dioxide. According to an exemplary embodiment, the filler layer 502 is deposited around the dummy gates 402a and 402b using a high-density plasma (HDP). Chemical-mechanical polishing (CMP) is then used to planarize the filler material using the dummy gates as an etch stop.

Figure 6:
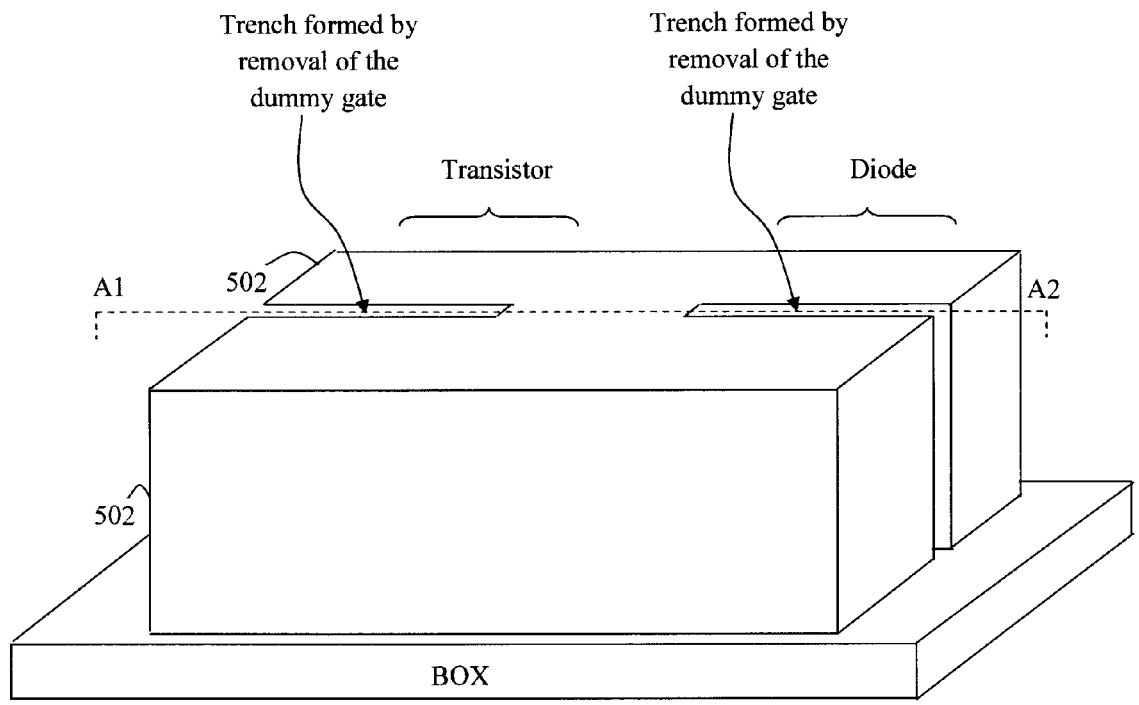
FIG. 6 is a three-dimensional diagram illustrating the dummy gates having been removed, leaving trenches in the filler layer according to an embodiment of the present invention.
Figure 7:
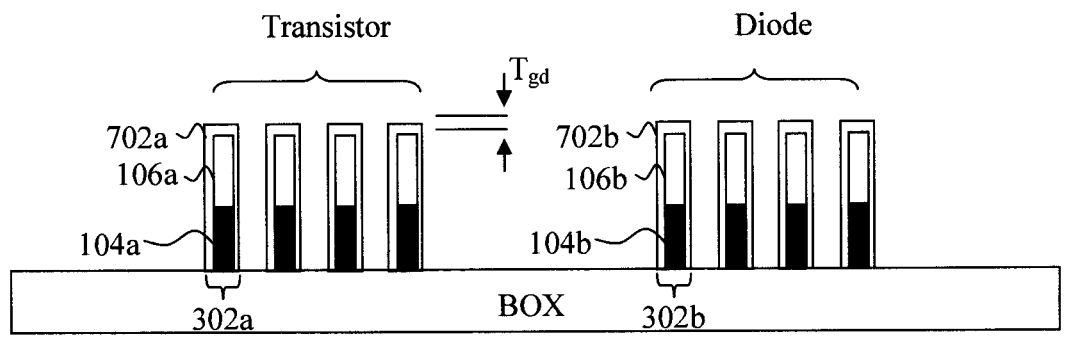
FIG. 7 is a cross-sectional diagram illustrating a gate dielectric having been deposited over the fins in the channel regions of each of the devices according to an embodiment of the present invention.

Next, as shown in FIG. 6, the dummy gates 402a and 402b are removed selective to the filler layer 502, leaving trenches in the filler layer 502. The dummy gates can be removed using wet chemical etching or dry etching. Removal of the dummy gates will expose a portion of the fins of each of the devices. As provided above, the dummy gates were formed over portions of the fins which will serve as channel regions of the respective devices. Thus, the portions of the fins now exposed in the trenches (after removal of the dummy gates) are the channel regions of the respective devices. To better illustrate the gate fabrication process, the orientation of the figures will now shift to cross sectional cuts along line A1-A2 (i.e., a cross-sectional cut through the fin channels along a length of the trenches). See FIG. 6.

A gate dielectric is then deposited over the fins in the channel regions of the devices. A portion of the gate dielectric on the transistor device(s) is given reference numeral 702a and a portion of the gate dielectric on the diode device(s) is given reference numeral 702b. See FIG. 7, which is a diagram illustrating a cross-sectional cut through the fins in the channel regions of the devices. According to an exemplary embodiment, the gate dielectric is formed from a high-k material, such as hafnium oxide or hafnium silicon-oxynitride that is deposited using a conformal deposition process such as atomic layer deposition (ALD) or chemical vapor deposition (CVD). By way of example only, the gate dielectric is deposited to a thickness $t_{gd}$ (see FIG. 7) of from about 1 nm to about 5 nm in both the transistor and diode devices. Ultimately, the goal will be to have the gate dielectric present only in the FINFET transistor device(s) separating the fin channels from the gate. The gate dielectric will be selectively removed from the FINFET-diode device(s).

Figure 8:
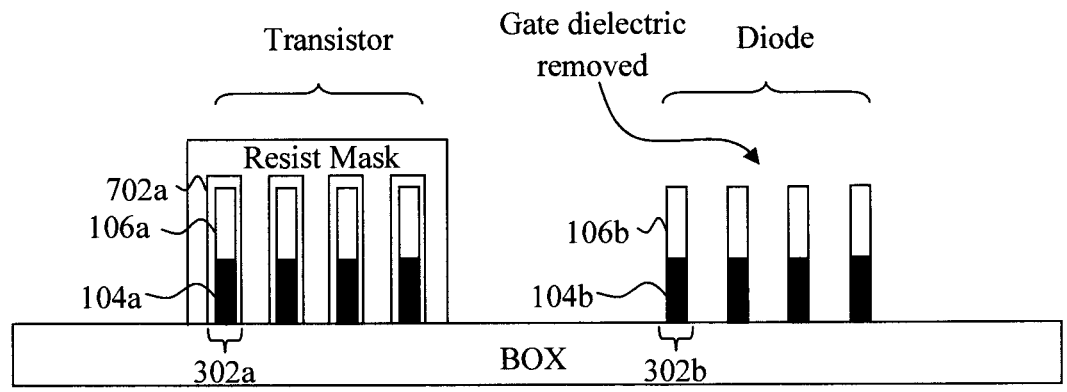
FIG. 8 is a cross-sectional diagram illustrating a resist mask having been formed over the transistor devices (thereby protecting the gate dielectric in the transistor device) and the gate dielectric having been (selectively) removed from the diode devices according to an embodiment of the present invention.

Namely, as shown in FIG. 8, also a cross-sectional depiction, standard lithography and etching techniques are used to pattern a resist mask over the FINFET transistor device(s) (i.e., thereby protecting portion 702a of the gate dielectric over the FINFET transistor device(s), such that portion 702a of the gate dielectric can remain in the FINFET transistor devices). The resist mask allows portion 702b of the gate dielectric to be (selectively) removed from the FINFET-diode devices. This mask is shown schematically in FIG. 8. Portion 702b of the gate dielectric is then removed from the diode devices. According to an exemplary embodiment, the gate dielectric is removed from the diode devices using a wet etching process—this is feasible if done after the gate dielectric deposition, but prior to any subsequent anneal. The resist mask can then be removed.

Figure 9:
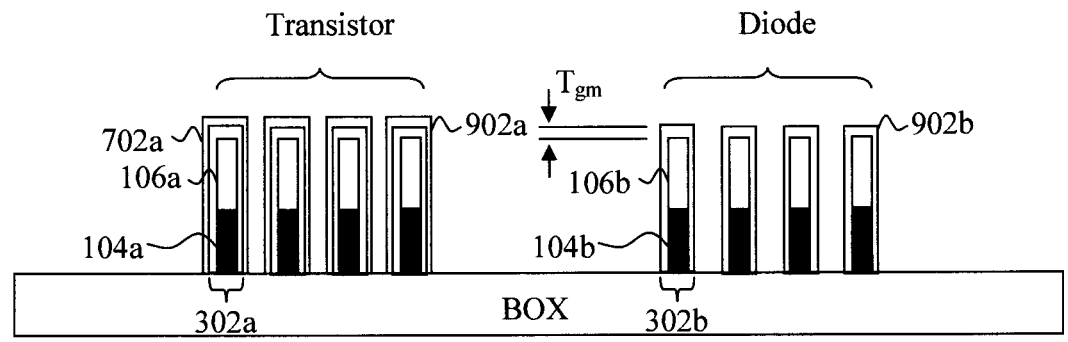
FIG. 9 is a cross-sectional diagram illustrating conformal gate metal layers having been deposited on the gate dielectric layer of the transistor devices and directly on the fins of the diode devices according to an embodiment of the present invention.

Next, as shown in FIG. 9, conformal gate metal layers 902a and 902b are deposited on portion 702a of the gate dielectric layer in the FINFET transistor devices and directly on the fins (since the gate dielectric has been removed from the fins—as described above) in the FINFET-diode devices, respectively. According to an exemplary embodiment, the gate metal layers 902a and 902b deposited concurrently and have the same composition. By way of example only, the gate metal layers 902a and 902b include a metal(s) such as titanium and/or tantalum, e.g., titanium nitride and/or tantalum nitride. Suitable deposition processes for conformally depositing the gate metal (especially in the case of titanium and tantalum gate metals) include, but are not limited to ALD and CVD. By way of example only, as shown in FIG. 9, the gate metal layers are deposited to a thickness $T_{gm}$ of (i.e., a uniform thickness across all of the devices) from about 5 nm to about 20 nm. However, it is also possible to deposit gate metal layers 902a and 902b separately, if so desired, which would enable tailoring the specific metal(s) employed on a device-type specific basis.

Since the gate metal layer in the diode will be deposited directly on the fins the result will be metal contact to either the n or p FIN region and forms one terminal of the diode. As will be described below, the gate metal layers 902a and 902b may be capped with more gate metal and/or other gate capping layers to complete the gate stacks of the devices. Thus, the completed gate stacks may also be referred to herein generally as a "metal gate stack." It is noted that the portions of the fins extending out from the metal gate stacks (see for example FIG. 11, described below) serve as source and drain regions of the FINFET transistor and FINFET-diode devices.

Figure 10:
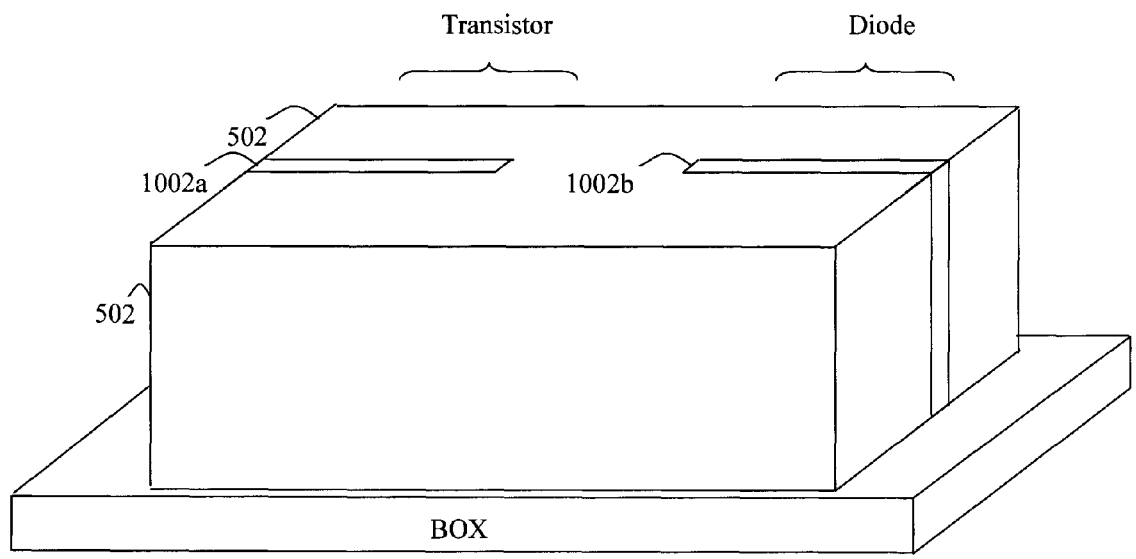
FIG. 10 is a three-dimensional diagram illustrating the gate metal layers having been capped with more gate metal and/or other gate capping layers to complete the gate stacks according to an embodiment of the present invention.
Figure 11:
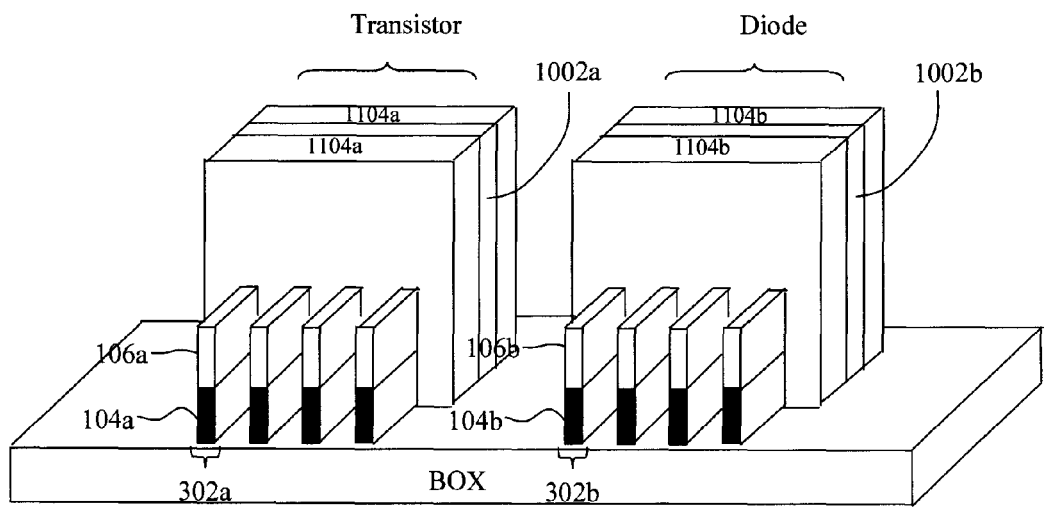
FIG. 11 is a three-dimensional diagram illustrating the filler layer having been removed and offset spacers having been formed on either side of the gate stacks according to an embodiment of the present invention.

Switching back to a cross-sectional view, FIG. 10 illustrates the remainder of the gate stack formation and patterning process. As shown in FIG. 10, the gate metal layers 902a and 902b are capped with more gate metal and/or other gate capping layers which may include for example polysilicon, tungsten (W) and/or silicon nitride (SiN) to complete the gate stacks 1002a and 1002b. As provided above, these gate stacks are also referred to herein as "replacement gates" since they replace the dummy gates which were removed earlier in the process.

Following completion of the gate stacks, the filler layer 502 can be removed, for example using a wet etch. Offset spacers (depicted here as 1104a and 1104b) are then formed on opposite sides of the gate stacks 1002a and 1002b, respectively. See FIG. 11. These spacers can be formed, for example, by a conformal deposition of a dielectric material followed by an anisotropic RIE with an overetch long enough to clear the sidewalls of the fins. According to an exemplary embodiment, the offset spacers include silicon nitride (SiN).

Figure 12:
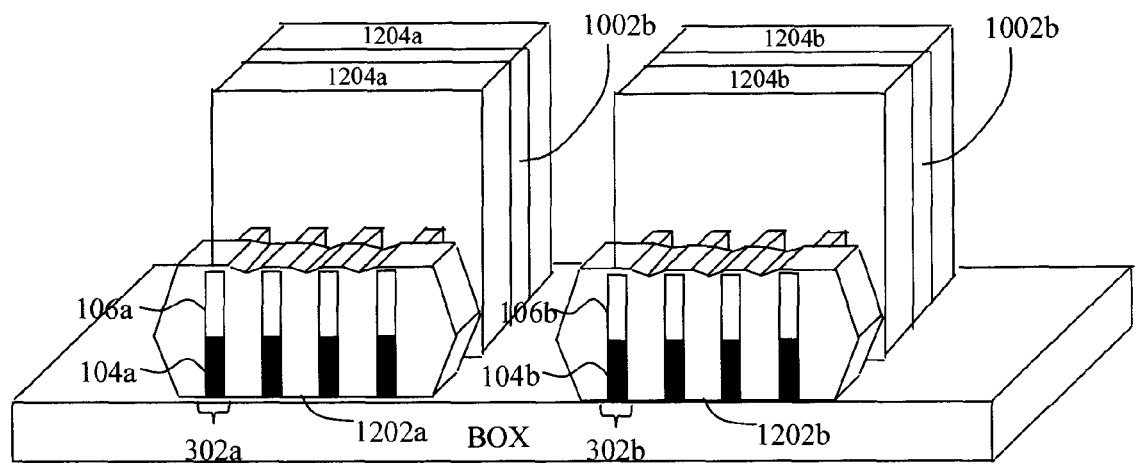
FIG. 12 is a three dimensional diagram illustrating source and drain regions of the device having been formed according to an embodiment of the present invention.

FIG. 12 illustrates the formation of either a source region or a drain region on one side of the gate, however it is to be understood that the same processes apply to forming the counterpart source region or drain region on the opposite side of the gate. Extension implants into fins 302a and 302b in the source/drain regions is also performed. As shown in FIG. 12, epitaxial silicon 1202a and 1202b is seeded from the fins 302a and 302b, respectively (in the source and drain regions of the device). Offset spacers 1104a and 1104b (see FIG. 11) may be removed and replaced by final spacers 1204a and 1204b, respectively. Source/drain implants are then introduced to the region, followed by a rapid thermal anneal. As a result, source/drain regions of each of the devices are formed.

Silicide contacts (not shown) to the source/drain regions may also be formed. The specific parameters for source region/drain region and silicide formation techniques are well known to those of skill in the art and thus are not described further herein. Any additional standard processing steps may also be performed, if so desired, to the device structure.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating an electronic device, comprising the steps of:
    providing a semiconductor-on-insulator (SOI) wafer having a SOI layer over a buried oxide (BOX);
    forming an oxide layer over the SOI layer;
    patterning at least one first set of fins in the SOI layer and the oxide layer and at least one second set of fins in the SOI layer and the oxide layer;
    forming a first dummy gate over a portion of each of the first set of fins that serves as a channel region of a transistor device;
    forming a second dummy gate over a portion of each of the second set of fins that serves as a channel region of a diode device;
    depositing a filler layer around the first dummy gate and the second dummy gate;
    removing the first dummy gate to expose the portion of the first set of fins that serves as the channel region of the transistor device within a first trench in the filler layer;
    removing the second dummy gate to expose the portion of the second set of fins that serves as the channel region of the diode device within a second trench in the filler layer;
    selectively forming a conformal gate dielectric layer on the portion of each of the first set of fins that serves as the channel region of the transistor device;
    forming a first metal gate stack on the conformal gate dielectric layer over the portion of each of the first set of fins that serves as the channel region of the transistor device; and
    forming a second metal gate stack on the portion of each of the second set of fins that serves as the channel region of the diode device.

2. The method of claim 1, further comprising the step of: doping the second set of fins.

3. The method of claim 2, wherein the second set of fins are doped with an n-type or a p-type dopant.

4. The method of claim 3, further comprising the steps of:
    forming one or more poly-silicon mandrels on the wafer;
    forming spacers on opposite sides of the poly-silicon mandrels;
    removing the poly-silicon mandrels; and
    using the spacers as a hardmask to pattern the first set of fins and the second set of fins in the SOI layer and the oxide layer.

5. The method of claim 1, wherein the first set of fins and the second set of fins are patterned in the SOI layer and the oxide layer using a sidewall image transfer process.

6. The method of claim 1, wherein the conformal gate dielectric layer comprises a high-k dielectric material.

7. The method of claim 6, wherein the high-k dielectric material comprises hafnium oxide.

8. The method of claim 1, wherein the conformal gate dielectric layer is deposited using chemical vapor deposition.

9. The method of claim 1, wherein the conformal gate dielectric layer is deposited to a thickness of from about 1 nm to about 5 nm.

10. The method of claim 1, further comprising the step of:
    depositing a conformal gate metal layer 1) on the conformal gate dielectric layer over the portion of the first set of fins that serves as the channel region of the transistor device and 2) directly on the portion of the second set of fins that serves as the channel region of the diode device.

11. The method of claim 10, wherein the conformal gate metal layer comprises one or more of titanium nitride and tantalum nitride.

12. The method of claim 10, wherein the conformal gate metal layer is deposited to a thickness of from about 5 nm to about 20 nm.

13. The method of claim 1, wherein the first dummy gate and the second dummy gate comprise polysilicon.

14. The method of claim 1, wherein the first dummy gate and the second dummy gate are removed using a wet etching process.

15. The method of claim 1, wherein the step of selectively forming the conformal gate dielectric layer on the portion of each of the first set of fins that serves as the channel region of the transistor device comprises the steps of:
    depositing the conformal gate dielectric layer on the portion of the first set of fins that serves as the channel region of the transistor device and on the portion of the second set of fins that serves as the channel region of the diode device; and
    selectively removing the dielectric layer from the second set of fins that serves as the channel region of the diode device.

16. The method of claim 15, further comprising the step of:
    masking the conformal gate dielectric layer deposited on the portion of the first set of fins that serves as the channel region of the transistor device.

17. The method of claim 15, wherein the dielectric layer is selectively removed from the second set of fins that serves as the channel region of the diode device using a wet etching process.

18. The method of claim 1, further comprising the step of:
    forming spacers on opposite sides of the first metal gate stack and on opposite sides of the second metal gate stack.

19. The method of claim 1, wherein portions of the first set of fins extending out from the first metal gate stack serve as source and drain regions of the transistor device, and wherein portions of the second set of fins extending out from the second metal gate stack serve as source and drain regions of the diode device, the method further comprising the step of:
    performing extension implants into the source and drain regions of the transistor device and into the source and drain regions of the diode device.

20. The method of claim 19, further comprising the step of:
    growing epitaxial silicon over the source and drain regions of the transistor device and over the source and drain regions of the diode device.

* * * * *